(12) United States Patent
Nishino

(10) Patent No.: US 7,676,531 B2
(45) Date of Patent: Mar. 9, 2010

(54) METHODS AND APPARATUS FOR RANDOM NUMBER GENERATION

(75) Inventor: Yoichi Nishino, Austin, TX (US)

(73) Assignee: Sony Computer Entertainment Inc., Tokyo (JP)

( * ) Notice: Subject to any disclaimer, the term of this patent is extended or adjusted under 35 U.S.C. 154(b) by 1111 days.

(21) Appl. No.: 11/318,225

(22) Filed: Dec. 22, 2005

(65) Prior Publication Data

US 2007/0147156 A1  Jun. 28, 2007

(51) Int. Cl.
*G06F 1/00* (2006.01)
(52) U.S. Cl. ..................................... 708/250
(58) Field of Classification Search .......... 708/250–256
See application file for complete search history.

(56) References Cited

U.S. PATENT DOCUMENTS

| 7,007,050 | B2* | 2/2006 | Saarinen | 708/250 |
|---|---|---|---|---|
| 2004/0254688 | A1* | 12/2004 | Chassin et al. | 700/295 |
| 2005/0144476 | A1* | 6/2005 | England et al. | 713/200 |
| 2006/0050580 | A1* | 3/2006 | Yamaguchi et al. | 365/201 |
| 2008/0126766 | A1* | 5/2008 | Chheda et al. | 712/226 |

* cited by examiner

*Primary Examiner*—Tan V Mai
(74) *Attorney, Agent, or Firm*—Matthew B. Dernier, Esq; Gibson & Dernier LLP

(57) ABSTRACT

Methods and apparatus provide for powering up a static random access memory (SRAM); interrogating at least some contents of the SRAM resulting from power up; and using the contents as at least a basis of a random number.

18 Claims, 5 Drawing Sheets

METHODS AND APPARATUS FOR RANDOM NUMBER GENERATION

BACKGROUND

The present invention relates to methods and apparatus for generating random numbers.

The use of random numbers, for example, in processing systems is becoming common and essential, particularly where secure communications functionality is desired. For example, a processing system may employ a random number generator, implemented using one or more ring oscillators, in order to permit a processor to generate a random number and use same to create secure modes. These modes may include encrypting sensitive data for later use and/or storage somewhere within the system or in some external device, establishing a virtual private network (VPN) between two network points, etc.

Existing multiprocessing systems in which a plurality of processors are coupled over a bus may employ a random number generator within the system that is used by all of the processors requiring random number generation. Among the uses of the random number generator is to assist in creating a virtual private network (VPN) between the multiprocessor system and an external system.

The problems associated with the prior art techniques is that the random number generator requires an undesirable amount of additional circuitry (e.g., including a plurality of ring oscillators) in order to achieve the desired functionality. Thus, there is a need in the art for new ways of achieving random number generation, preferably that makes use of existing circuitry in the system in which it is employed.

SUMMARY OF THE INVENTION

One or more embodiments of the present invention relates to a technique for generating a random number in a processor system. For example, it is assumed that the processor includes an static random access memory (SRAM) of significant size, for example, 1 MB (other memory sizes may also be employed). Preferably substantially immediately after power on, the contents of the SRAM are read out and used as the basis of a random number. While the invention is not intended to be limited to any particular theory of operation, is believed that each SRAM flip flop is implemented by way of a symmetrical transistor circuit that is just as likely to power up in a logic high state as in a logic low state. For example, it can be estimated that the probability that the state of the flip flops in a 512 KB SRAM will repeat at power up (assuming 99.9% symmetry) is $10^{-100}$, a low probability indeed.

The contents of the SRAM may be interrogated using a built in self test (BIST) circuit or may be read using the CPU of the processor. In one embodiment, a hardware implemented hash function is included on-chip. The contents of the SRAM are directed into the hash function in order to produce a random number having a relatively low number of bits (such as 128 bits). It is contemplated that the entirety or only a portion of the SRAM is used as the basis of the random number.

In an alternative embodiment, the hash function may be implemented using a dedicated software program that is stored in a ROM (preferably MD5 programmed). The ROM may be disposed on-chip or off-chip. The CPU may be used to access the hash function stored on the ROM and execute the program on the contents of the SRAM to produce the random number. When the ROM is located off-chip, the SRAM preferably includes a dedicated area for MD5 execution. Thus, only a portion of the SRAM contents are preferably input into the hash function and used as the basis for the random number.

In accordance with one or more embodiments of the present invention, methods and apparatus may provide for: powering up a static random access memory (SRAM); interrogating at least some contents of the SRAM resulting from power up; and using the contents as at least a basis of a random number. The methods and apparatus may further provide for reading predetermined storage locations of the SRAM to obtain the contents of the SRAM.

Preferably, the contents of the SRAM are post processed to produce the random number. For example, the contents of the SRAM may be of N bits and the random number may be of M bits, where N>M. The post processing may include using a hash algorithm to produce the random number. Alternatively or in addition, the post processing may include creating an M-bit message digest from the contents of the SRAM. For example, the message digest may be produced using one of the MD5, MD4 and MD2 algorithms.

In one or more embodiments, a portion of the SRAM may be used to store program code for executing the post processing to produce the random number.

In accordance with one or more embodiments of the present invention, an apparatus includes: a static random access memory (SRAM) including a plurality of storage locations operable to latch into a logic high or a logic low upon power up; and an interrogation circuit operable to obtain contents of at least some of the storage locations, where the contents are usable as at least a basis for a random number.

In one or more embodiments, the interrogation circuit includes a built in test circuit operable to read predetermined storage locations of the SRAM to obtain the contents of the SRAM. The built in test circuit may include an address generator and a controller operable to produce addresses of the predetermined storage locations.

In one or more further embodiments, the interrogation circuit includes: a processor operable to execute program code that causes the processor to read at least some storage locations of the SRAM to obtain the contents of the SRAM; and a storage circuit coupled to the processor and operable to store the program code. The processor is preferably operable to post process the contents of the SRAM to produce the random number by executing further program code. The further program code may be operable to cause the processor to carry out one or more of: (i) a hash algorithm to produce the random number; (ii) an M-bit message digest from the contents of the SRAM; and (iii) at least one of MD5, MD4 and MD2 algorithms.

In one or more embodiments, the processor is operable to read the further program code from the storage circuit into a portion of the SRAM for executing the post processing to produce the random number.

The storage circuit may be disposed on-chip with, or external to, the processor.

In one or more embodiments, the apparatus may include a hardware implemented post processing circuit operable to manipulate the contents of the SRAM to produce the random number. The post processing circuit may be operable to carry out: a hash algorithm to produce the random number; an M-bit message digest from the contents of the SRAM (such as the MD5, MD4 and MD2 algorithms).

In accordance with one or more further embodiments of the invention, an apparatus includes: a plurality of processors capable of operative communication with a main memory; a respective local static random access memory (SRAM) coupled to each of the processors, each local SRAM including a plurality of storage locations operable to latch into a logic high or a logic low upon power up; and an respective interrogation circuit operable to obtain contents of at least some of the storage locations of an associated local SRAM, where the contents are usable as at least a basis for a random number.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PRESENT INVENTION

With reference to the drawings, wherein like numerals indicate like elements, there is shown in the figures various systems that may be operable and/or adapted for carrying out one or more features of the present invention. For the purposes of brevity and clarity, the block diagrams of the figures will be referred to and described herein as illustrating one or more apparatus, it being understood, however, that the description may readily be applied to various aspects of one of more methods with equal force.

Figure 1:
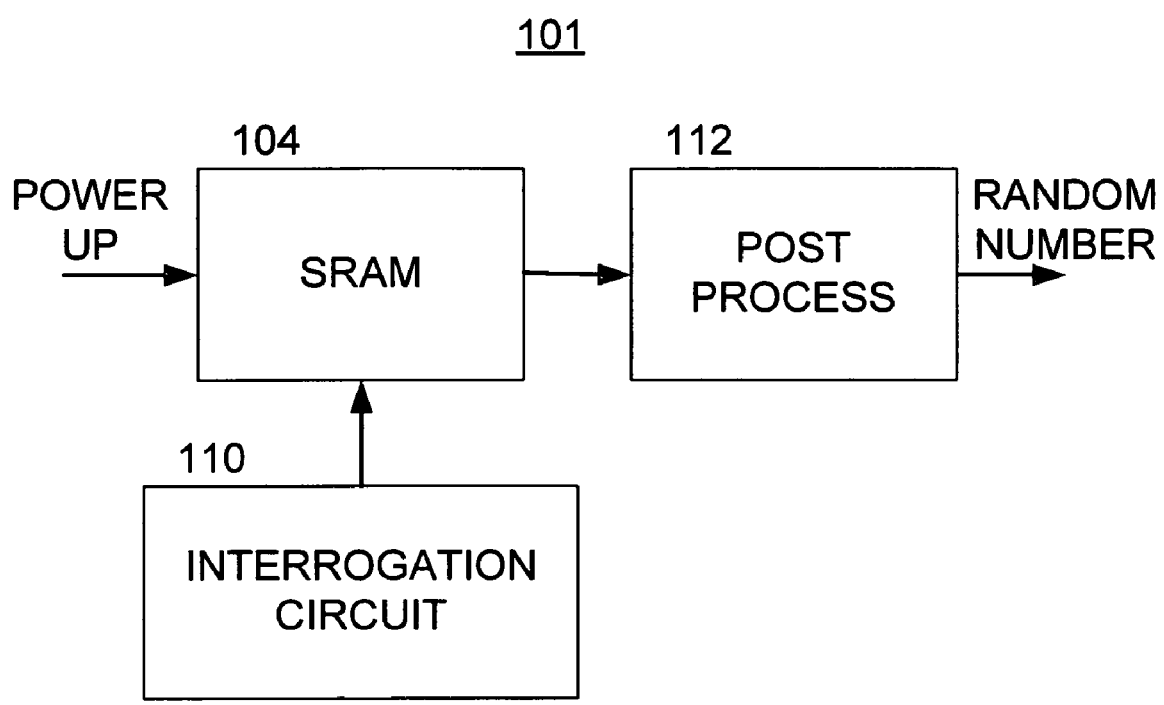
FIG. 1 is a block diagram illustrating the structure of a random number generator in accordance with one or more aspects of the present invention.

FIG. 1 is a block diagram illustrating the structure of a random number generator 101 in accordance with one or more aspects of the present invention. The random number generator 101 includes a static random access memory (SRAM) 104, an interrogation circuit 110, and optionally a post process circuit 112. The SRAM 104 may be of any significant size, for example, 512 KB, 1 MB, etc. The SRAM 104 is preferably implemented utilizing a plurality of flip flop circuits, each flip flop circuit representing a storage location (or portion of a storage location). So long as power is applied to the SRAM 104, each flip flop circuit is capable of storing a logic high or a logic low, depending on how the flip flop was programmed. Assuming that the flip flop circuits are symmetrically designed, each is theoretically just as likely to power up in a logic high state as in a logic low state. The interrogation circuit is preferably operable to obtain the contents of at least some of the storage locations within the SRAM 104.

Figure 2:
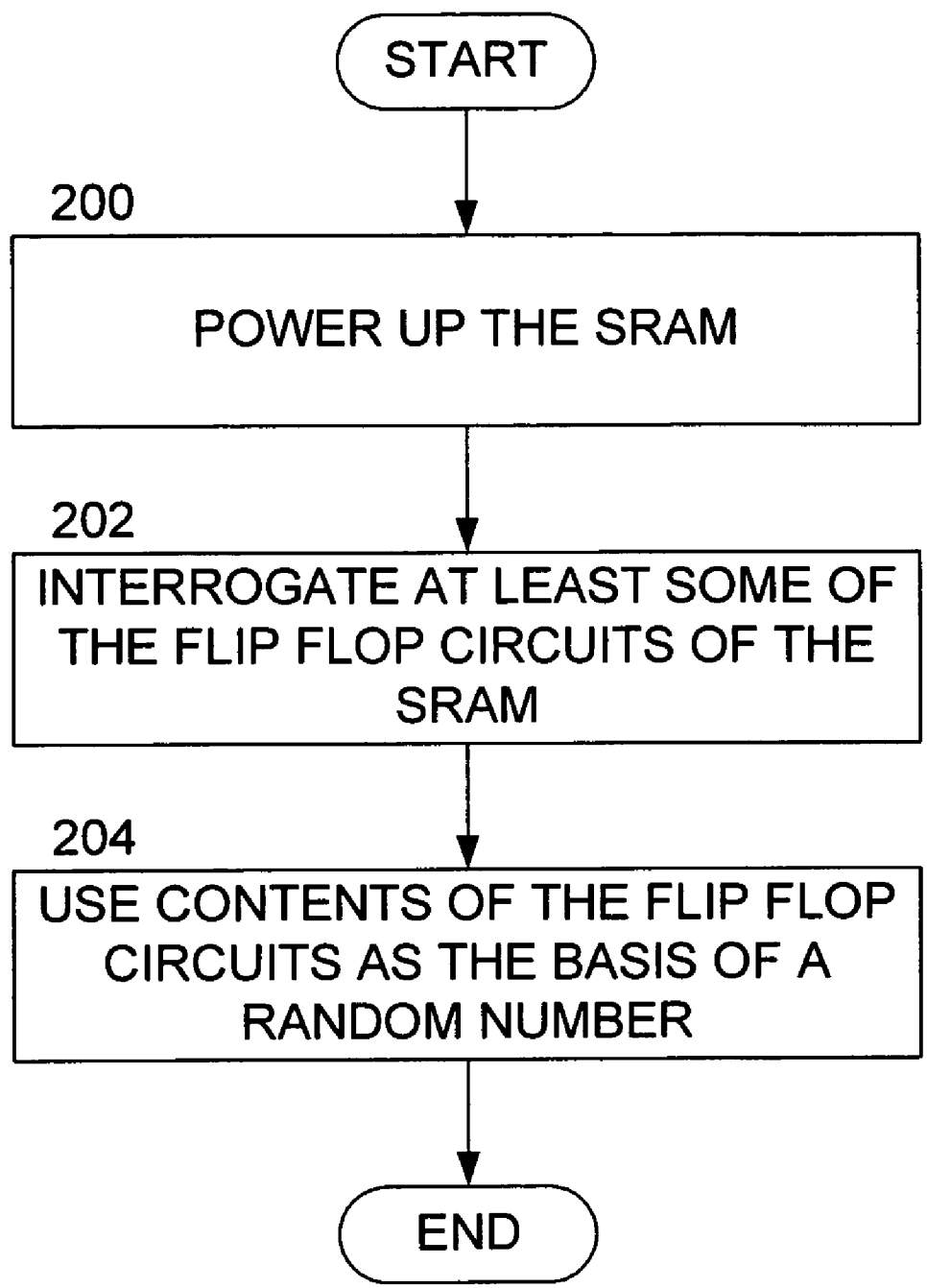
FIG. 2 is a flow diagram illustrating process steps that may be carried out by the random number generator of FIG. 1 and/or other embodiments herein in accordance with one or more aspects of the present invention.

Reference is now made to FIG. 2, which is a flow diagram illustrating process steps that may be carried out by the random number generator 101 of FIG. 1 (and/or other embodiments herein). At action 200, the SRAM 104 is powered up, such as by initially applying an operating voltage to the SRAM 104. Without limiting the invention to any theory of operation, it is believed that the probability that the state of the flip flop circuits in the SRAM 104 will repeat at power up is extremely low. Therefore, after action 200, it is assumed that the states of at least some of the flip flop circuits of the SRAM 104 represent a random collection of logic high and logic low states. At action 202, the interrogation circuit preferably operates to obtain the contents of at least some of the flip flop circuits (or collections thereof), where the contents are usable as at least a basis for a random number (action 204).

The post process circuit 112 is preferably operable to manipulate the contents of the SRAM 104 (obtained during action 202) to produce the random number. This may entail applying an algorithm that reduces the number of bits in the random number as compared with the number of bits within the contents of the SRAM 104. By way of example, the post processing circuit 112 may be operable to carry out any of the known or hereinafter developed hash algorithms, such as the SHA-1 algorithm. Alternatively, or in addition, the post processing circuit 112 may be operable to perform a compression algorithm, such as the shift and sum algorithm. Alternatively, or in addition, the post processing circuit 112 may be operable to create an M-bit message digest from the contents of the SRAM 104. Examples of algorithms suitable for creating the message digest include the MD5, MD4, and MD2 algorithms.

MD5 is an algorithm that is used to verify data integrity through the creation of a 128-bit message digest from data input (which may be a message of any length). It is believed that the 128-bit message digest is as unique to that specific data as a fingerprint is to a specific individual. MD5 was developed by Professor Ronald L. Rivest of MIT and is suited for use with digital signature applications, which entail compressing large files by a secure method before being encrypted with a secret key, under a public key cryptosystem. MD5 is the third message digest algorithm created by Rivest, where all three (the others being MD2 and MD4) have similar structures. MD2 was optimized for 8-bit machines, in comparison with the two later formulas, which are optimized for 32-bit machines.

Figure 3:
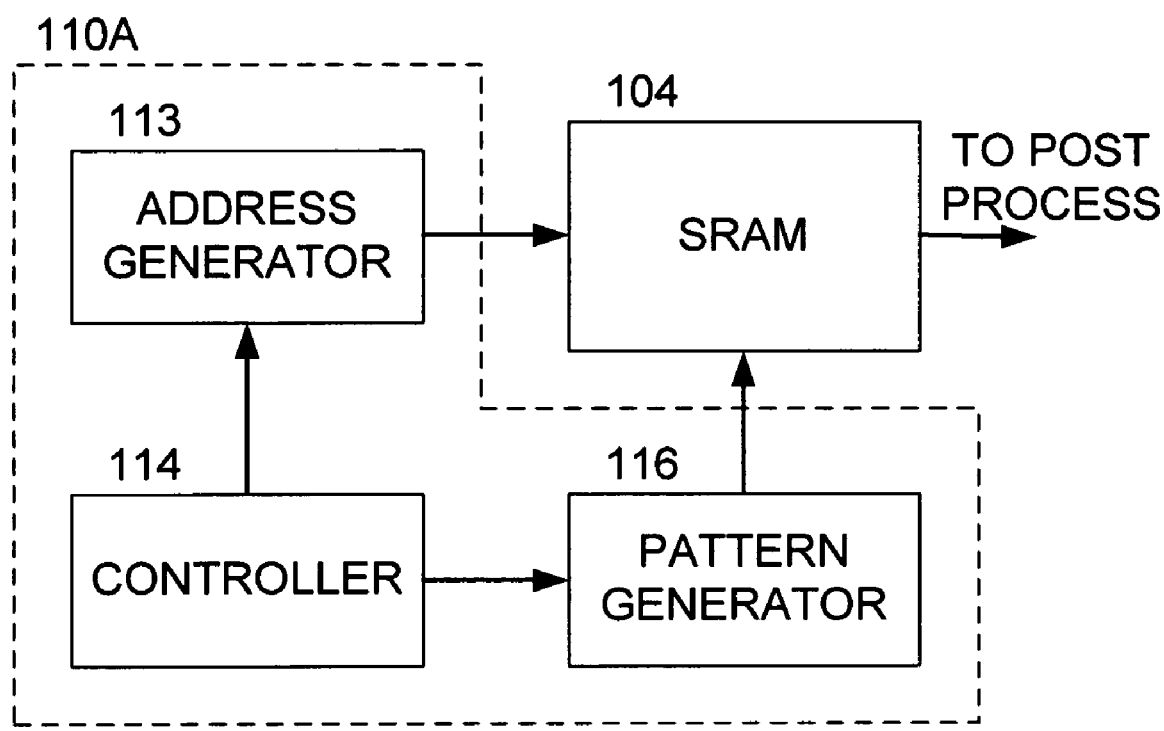
FIG. 3 is a block diagram illustrating further details of the random number generator of FIG. 1 in accordance with one or more further aspects of the present invention.

Reference is now made to FIG. 3, which is a block diagram illustrating further details of the random number generator 101 of FIG. 1 in accordance with one or more embodiments of the present invention. In these embodiments, the interrogation circuit 110A preferably includes a built-in test circuit operable to read predetermined storage locations of the SRAM 104 to obtain the contents thereof. In particular, the built-in test circuit may include an address generator 113, a controller 114, and a pattern generator 116. The controller 114 is preferably operable to interface with the address generator 113 and the pattern generator 116 in order to interrogate the predetermined storage locations of the SRAM 104. In one or more embodiments, the pattern generator 116 is operable to change the predetermined storage locations to be interrogated from time to time.

Figure 4:
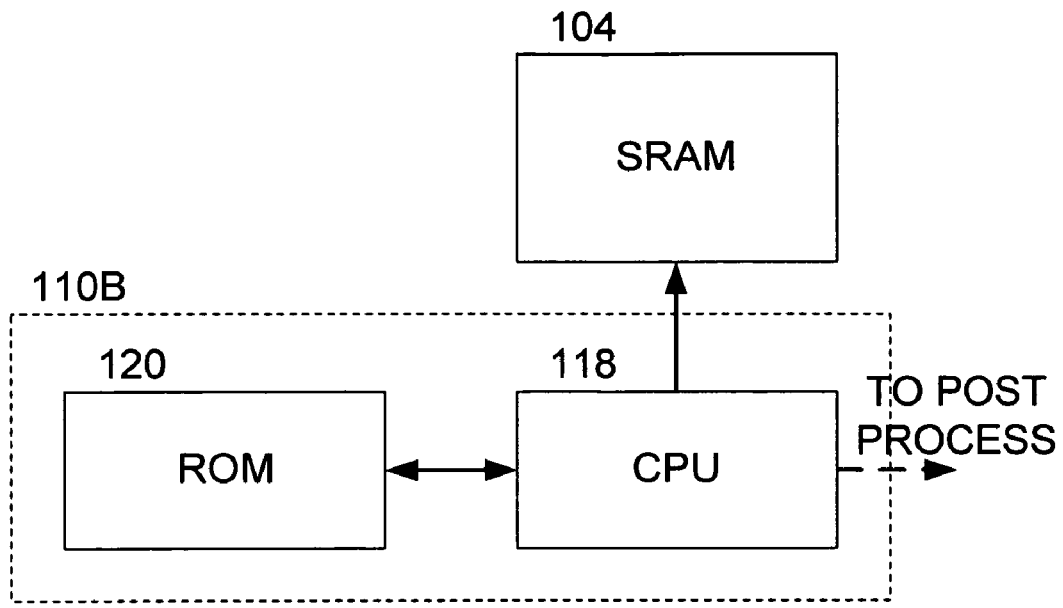
FIG. 4 is a block diagram illustrating alternative and/or additional details of the random number generator of FIG. 1 in accordance with one or more further aspects of the present invention.

With reference to FIG. 4, the interrogation circuit 110B may be implemented in a different way. In particular, the interrogation circuit 110B may include a processor (or central processing unit CPU) 118 and a storage circuit 120. In a preferred embodiment, the storage circuit 120 is a read only memory (ROM). The processor 118 is preferably operable to execute program code that causes the processor 118 to read at least some storage locations of the SRAM 104 to obtain the contents thereof. The storage circuit 120 is preferably coupled to the processor 118 in such a way as to store the program code for access by the processor 118. In operation, the processor 118 is preferably operable to interrogate the SRAM 104 to obtain the contents thereof after power-up in accordance with the program code stored in the storage circuit 120. Thereafter, the contents of the SRAM 104 may be provided to the post process circuit 112 if such is desired.

Figure 5:
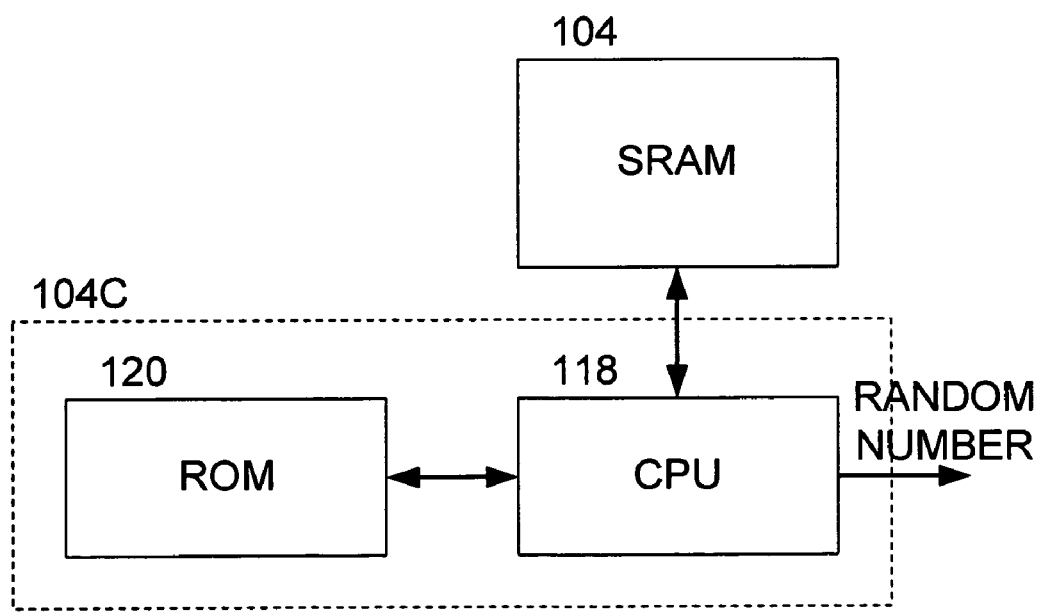
FIG. 5 is a block diagram illustrating still further alternative and/or additional details of the random number generator of FIG. 1 in accordance with one or more further aspects of the present invention.

In an alternative embodiment illustrated in FIG. 5, the processor 118 is also preferably operable to carry out post processing on the contents on the SRAM 104 to produce the random number. In this regard, the storage circuit 120 preferably contains a further program that is operable to cause the processor 118 to carry out at least one of a hash algorithm, a compression algorithm, and/or an M-bit message digest in order to produce the random number. Those skilled in the art will appreciate that alternative post processing techniques may be employed in order to produce the random number. In a preferred embodiment, the processor 118 is preferably operable to carry out one or more of the MD5, MD4, and MD2 algorithms.

Figure 6:
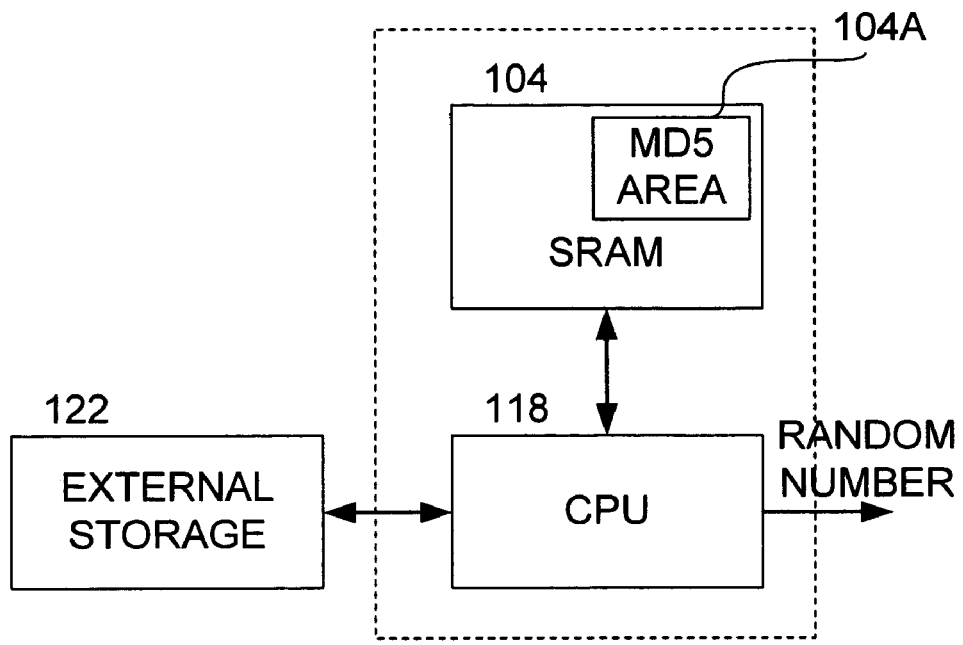
FIG. 6 is a block diagram illustrating still further alternative and/or additional details of the random number generator of FIG. 1 in accordance with one or more further aspects of the present invention.

In an alternative embodiment illustrated in FIG. 6, the processor 118 and SRAM 104 are preferably integrally disposed in a device, such as an on-chip integrated circuit. A storage circuit 122 is preferably disposed externally thereto. The external storage circuit 122 is preferably operable to store at least one of the programs discussed hereinabove with respect to interrogation of the SRAM 104 and/or post processing of the contents of the SRAM 104. In accordance with this embodiment, processor 118 is preferably operable to read program code from the external storage circuit 122 for post processing and store same in at least a portion 104A of the SRAM 104. In a preferred embodiment, the program code is operable to carry out the MD5 algorithm. After the SRAM 104 is powered up and the contents are obtained by the processing 118, the processor 118 preferably utilizes the area 104A of the SRAM 104 in order to execute the post processing (e.g., MD5 algorithm) on the contents in order to produce the random number.

Figure 7:
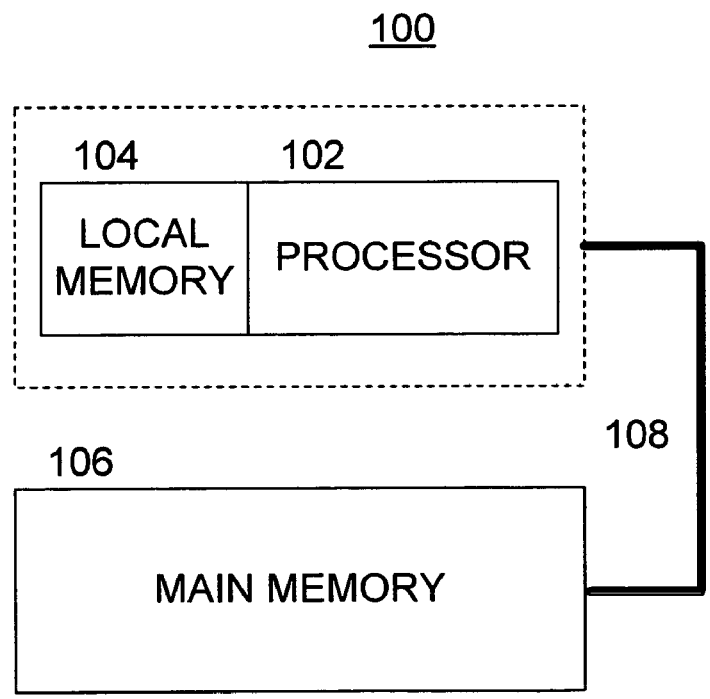
FIG. 7 is a diagram illustrating the structure of a processing system that may be adapted in accordance with one or more aspects of the present invention.

Reference is now made to FIG. 7, which illustrates a system or apparatus 100 that is adapted using the random number generator 101 discussed above. The apparatus 100 preferably includes a processor 102, a local memory 104, a main memory 106 (e.g., a DRAM), and a bus 108. The processor 102 may be implemented utilizing any of the known technologies that are capable of requesting data from the system memory 106, and manipulating the data to achieve a desirable result. For example, the processor 102 may be implemented using any of the known microprocessors that are capable of executing software and/or firmware, including standard microprocessors, distributed microprocessors, etc. By way of example, the processor 102 may be a graphics processor that is capable of requesting and manipulating data, such as pixel data, including gray scale information, color information, texture data, polygonal information, video frame information, etc.

The processor 102 is preferably implemented using a processing pipeline, in which logic instructions are processed in a pipelined fashion. Although the pipeline may be divided into any number of stages at which instructions are processed, the pipeline generally comprises fetching one or more instructions, decoding the instructions, checking for dependencies among the instructions, issuing the instructions, and executing the instructions. In this regard, the processor 102 may include an instruction buffer, instruction decode circuitry, dependency check circuitry, instruction issue circuitry, and execution stages.

The system memory 106 is preferably a dynamic random access memory (DRAM) coupled to the processors 102 through a high bandwidth memory connection (not shown). Although the system memory 106 is preferably a DRAM, the memory 106 may be implemented using other means, e.g., a static random access memory (SRAM), a magnetic random access memory (MRAM), an optical memory, a holographic memory, etc.

The local memory 104 is located in proximity to the processor 102 such that the processor may execute program code and otherwise manipulate data within the local memory 104 as opposed to the system memory 106. The local memory 104 is preferably not a traditional hardware cache memory in that there are preferably no on chip or off chip hardware cache circuits, cache registers, cache memory controllers, etc. to implement a hardware cache memory function. As on-chip space may be limited, the size of the local memory 104 may be much smaller than the system memory 106.

Preferably, the local memory 104 is implemented using a static random access memory (SRAM). The system 100 preferably includes additional components (such as an interrogation circuit 110 and post process circuit 112) in order to implement a random number generator 101 as discussed herein above. It is contemplated that any of the implementations of the random number generator 101 discussed above or the equivalents thereof may be employed in the system 100.

In one or more embodiments, the processor 102 and the local memory 104 may be disposed on a common semiconductor substrate. In one or more further embodiments, the shared memory 106 may also be disposed on the common semiconductor substrate or it may be separately disposed.

In one or more further embodiments of the invention, the random number generator 101 may be implemented in a multi-processor system. It is contemplated that one or more of the processors of the multi-processor system may include a random number generator 101 to produce random number(s). Thus, for example, the processors of the multi-processor system may achieve independent security features by way of separate random number generators 101.

In accordance with at least one further aspect of the present invention, the methods and apparatus described above may be achieved utilizing suitable hardware, such as that illustrated in the figures. Such hardware may be implemented utilizing any of the known technologies, such as standard digital circuitry, any of the known processors that are operable to execute software and/or firmware programs, one or more programmable digital devices or systems, such as programmable read only memories (PROMs), programmable array logic devices (PALs), etc. Furthermore, although the apparatus illustrated in the figures are shown as being partitioned into certain functional blocks, such blocks may be implemented by way of separate circuitry and/or combined into one or more functional units. Still further, the various aspects of the invention may be implemented by way of software and/or firmware program(s) that may be stored on suitable storage medium or media (such as floppy disk(s), memory chip(s), etc.) for transportability and/or distribution.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method, comprising:
powering up a static random access memory (SRAM);
interrogating at least some contents of the SRAM resulting from power up;
reading predetermined storage locations of the SRAM to obtain the contents of the SRAM; and
using the contents as at least a basis of a random number.

2. The method of claim 1, further comprising post processing the contents of the SRAM to produce the random number.

3. The method of claim 2, wherein the contents of the SRAM is of N bits and the random number is of M bits, where N>M.

4. The method of claim 2, wherein the post processing includes using a hash algorithm to produce the random number.

5. The method of claim 2, wherein the post processing includes creating an M-bit message digest from the contents of the SRAM.

6. The method of claim 5, wherein the message digest is produced using one of MD5, MD4 and MD2 algorithms.

7. The method of claim 2, further comprising using a portion of the SRAM to store program code for executing the post processing to produce the random number.

8. An apparatus, comprising:
a static random access memory (SRAM) including a plurality of storage locations operable to latch into a logic high or a logic low upon power up; and
an interrogation circuit operable to obtain contents of at least some of the storage locations, and including a built in test circuit operable to read predetermined storage locations of the SRAM to obtain the contents of the SRAM, where the contents are usable as at least a basis for a random number.

9. The apparatus of claim 8, wherein the built in test circuit includes an address generator and a controller operable to produce addresses of the predetermined storage locations.

10. The apparatus of claim 8, wherein the interrogation circuit includes:
a processor operable to execute program code that causes the processor to read at least some storage locations of the SRAM to obtain the contents of the SRAM; and
a storage circuit coupled to the processor and operable to store the program code.

11. The apparatus of claim 10, wherein the processor is operable to post process the contents of the SRAM to produce the random number by executing further program code.

12. The apparatus of claim 11, wherein at least one of:
the further program code is operable to cause the processor to carry out a hash algorithm to produce the random number;
the further program code is operable to cause the processor to carry out an M-bit message digest from the contents of the SRAM; and
the further program code is operable to cause the processor to carry out at least one of MD5, MD4 and MD2 algorithms.

13. The apparatus of claim 11, wherein the processor is operable to read the further program code from the storage circuit into a portion of the SRAM for executing the post processing to produce the random number.

14. The apparatus of claim 11, wherein the storage circuit is disposed on-chip with the processor.

15. The apparatus of claim 8, further comprising a post processing circuit operable to manipulate the contents of the SRAM to produce the random number.

16. The apparatus of claim 15, wherein the post processing circuit is operable to carry out a hash algorithm to produce the random number.

17. The apparatus of claim 15, wherein at least one of:
the post processing circuit is operable to create an M-bit message digest from the contents of the SRAM; and
the message digest is produced using one of MD5, MD4 and MD2 algorithms.

18. An apparatus, comprising:
a plurality of processors capable of operative communication with a main memory;
a respective local static random access memory (SRAM) coupled to each of the processors, each local SRAM including a plurality of storage locations operable to latch into a logic high or a logic low upon power up; and
a respective interrogation circuit operable to obtain contents of at least some of the storage locations of an associated local SRAM, and including a built in test circuit operable to read predetermined storage locations of the SRAM to obtain the contents of the SRAM, where the contents are usable as at least a basis for a random number.

* * * * *